Figure 1:
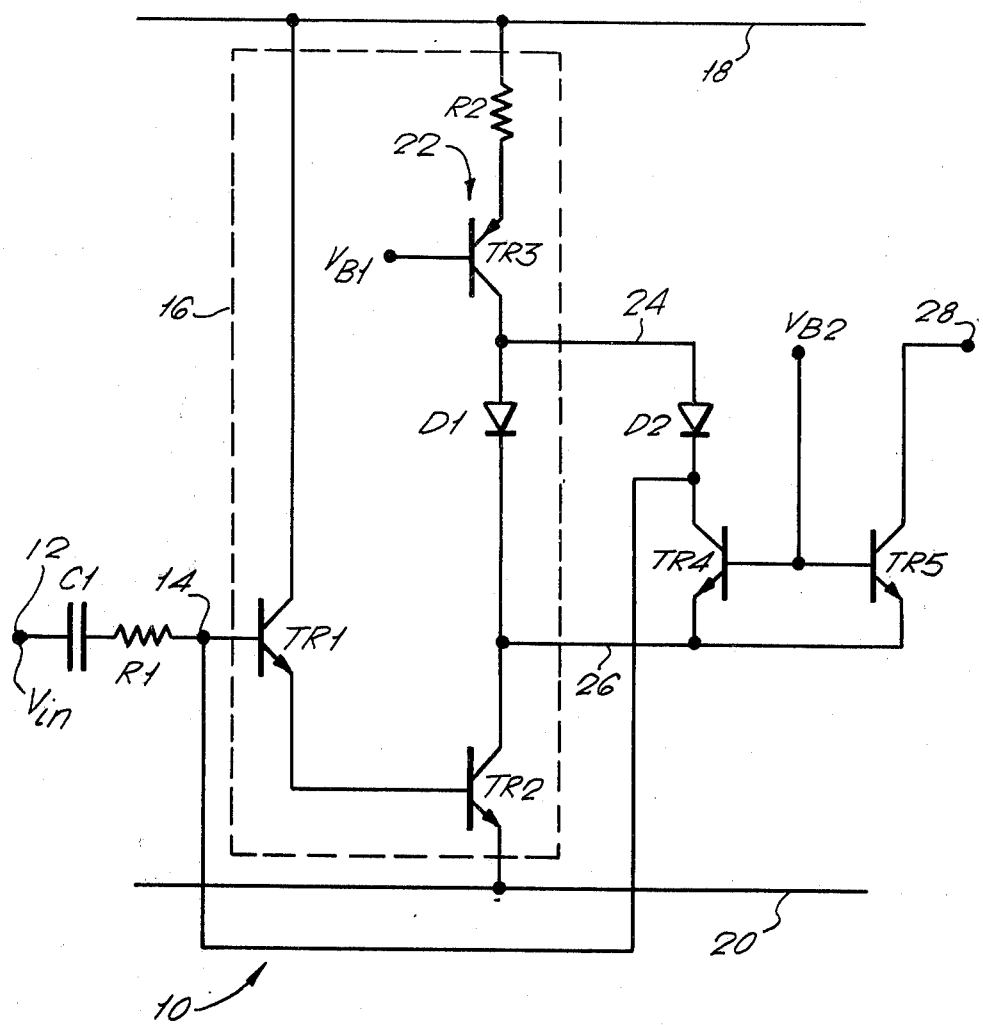

United States Patent [19]

Ryder

[11] 4,004,161
[45] Jan. 18, 1977

[54] RECTIFYING CIRCUITS

[75] Inventor: Alan Ryder, Church Crookham, near Aldershot, England

[73] Assignee: The Solartron Electronic Group Limited, Farnborough, England

[22] Filed: Oct. 28, 1975

[21] Appl. No.: 626,144

[30] Foreign Application Priority Data

Nov. 8, 1974 United Kingdom ............ 48359/74

[52] U.S. Cl. .................................. 307/261; 328/26
[51] Int. Cl.² ........................................ H02M 7/217
[58] Field of Search ....................... 321/8 R, 46, 47; 324/119; 307/260, 261; 330/38 M, 103; 328/26

[56] References Cited

UNITED STATES PATENTS

| 3,310,726 | 3/1967 | James | 321/8 R |
| 3,411,066 | 11/1968 | Bravenec | 321/8 R |
| 3,493,784 | 2/1970 | Brolin | 307/260 |
| 3,940,681 | 2/1976 | Ohsawa | 321/47 |

FOREIGN PATENTS OR APPLICATIONS

| 1,214,313 | 12/1970 | United Kingdom | 321/47 |

Primary Examiner—William H. Beha, Jr.
Attorney, Agent, or Firm—William R. Sherman; Stewart F. Moore; Kevin McMahon

[57] ABSTRACT

A rectifying circuit comprises a high gain A.C. amplifier having first and second rectifying means connected in respective negative feedback paths between its output and its input and arranged to pass respective feedback currents of opposite polarity. A current copying device is responsive to the current flowing in one of the rectifying means to copy this current.

In a preferred embodiment, said one rectifying means comprises the base-emitter junction of a first transistor, whose collector is connected to the input of the amplifier, and the current copying means comprises a second transistor, matched with the first transistor, and having its base-emitter junction connected in parallel with the base-emitter junction of the first transistor. The rectified output signal in this embodiment is taken from the free collector of the second transistor.

6 Claims, 3 Drawing Figures

RECTIFYING CIRCUITS

This invention relates to rectifying circuits, and is more particularly but not exclusively concerned with a rectifying circuit for use, in conjunction with a digital multimeter, in measuring the amplitude of an A.C. input signal.

A known form of rectifying circuit, frequently used in digital multimeters, comprises a high gain A.C. amplifier for receiving an A.C. input signal to be measured, the amplifier having two negative feedback paths each comprising a diode in series with a resistance. The diodes are oppositely connected with respect to each other, so that they produce across their respective resistances respective half-wave rectified feedback voltages of opposite polarity. At least one of these feedback voltages is applied to a low-pass filter to produce a D.C. output voltage whose magnitude is dependent on the amplitude of the A.C. input signal, and this D.C. output voltage is then measured by the digital multimeter.

This type of rectifying circuit has several disadvantages. Firstly, the level of the output voltage produced in response to a zero amplitude A.C. input signal is dependent on the input offset voltage of the amplifier, and it is usually necessary to provide additional circuitry to reduce the effect of this input offset voltage to a negligible value. Secondly, the output impedance of the circuit is non-linear, and depends on the instantaneous current flow in the diode with which the filter is associated. Additionally, if the filter is of the type in which the D.C. output voltage produced thereby can cause a current to flow back into the output node of the rectifying circuit during the time when the output voltage at this node should be zero (and all passive and many active filters are of this type), then this current can impair the rectifying action of the circuit.

It is an object of the present invention to provide a rectifying circuit in which the abovementioned disadvantages are substantially alleviated.

According to one aspect of the present invention, therefore, there is provided a rectifying circuit comprising a high gain A.C. amplifier for receiving an A.C. input singal to be rectified, first and second rectifying means connected in respective negative feedback paths between the output of the amplifier and its input, said paths being arranged to pass respective feedback currents of opposite polarity, and current copying means responsive to the signal applied by the amplifier to one of the rectifying means to pass a current substantially proportional, and preferably approximately equal, to the feedback current in said one rectifying means, the rectified output signal from the circuit being derived from the current copying means.

The current passed by the current copying means is substantially unaffected by the input offset voltage of the amplifier, so that a very simple circuit can be used for the amplifier. Additionally, the output impedance of the current copying means can be made very high for all regions of the waveform of the rectified output signal and, when the rectified output signal is applied to a filter, the filter has little or no effect on the rectifying action of the circuit.

In one embodiment of the invention, the current copying means comprises a transistor whose base-emitter junction is connected in parallel with said one rectifying means and whose collector constitutes the output of the circuit. In this case, said one rectifying means may comprise a semiconductor diode or, alternatively and preferably, it may comprise the base-emitter junction of a second transistor substantially matched to the firstmentioned transistor, the collector of the second transistor being connected to the input of the amplifier.

In another embodiment of the invention, the current copying means and said one rectifying means together comprise an inverse-connected transistor having at least first and second emitters, the first emitter and the collector of the transistor being respectively connected to the input and to the output of the amplifier, and the second emitter constituting the output of the circuit.

According to another aspect of the present invention, there is provided a rectifying circuit comprising a high gain A.C. amplifier for receiving an A.C. input signal to be rectified and first and second rectifying means connected in respective negative feedback paths between the output of the amplifier and its input, said paths being arranged to pass respective feedback currents of opposite polarity, wherein at least one of said rectifying means comprises either the base-emitter junction or the base-collector junction of a transistor, the output of the circuit being constituted in the former case by the collector of the transistor and in the latter case by the emitter of the transistor.

Preferably the transistor is a field effect transistor, in which case the terms "emitter" and "collector" are to be understood as referring to the terminals of the transistor more commonly referred to as the source and drain respectively.

The other rectifying means may conveniently comprise a semiconductor diode.

Figure 2:
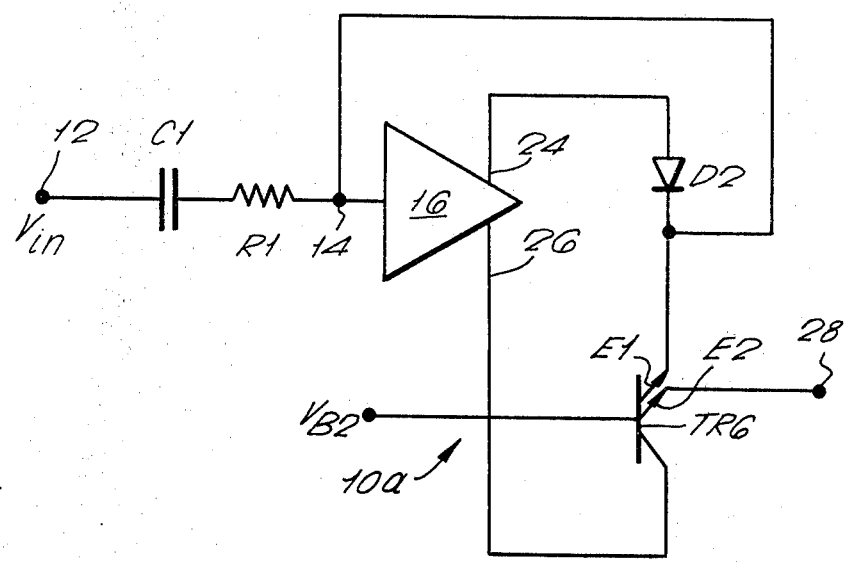
Figure 3:
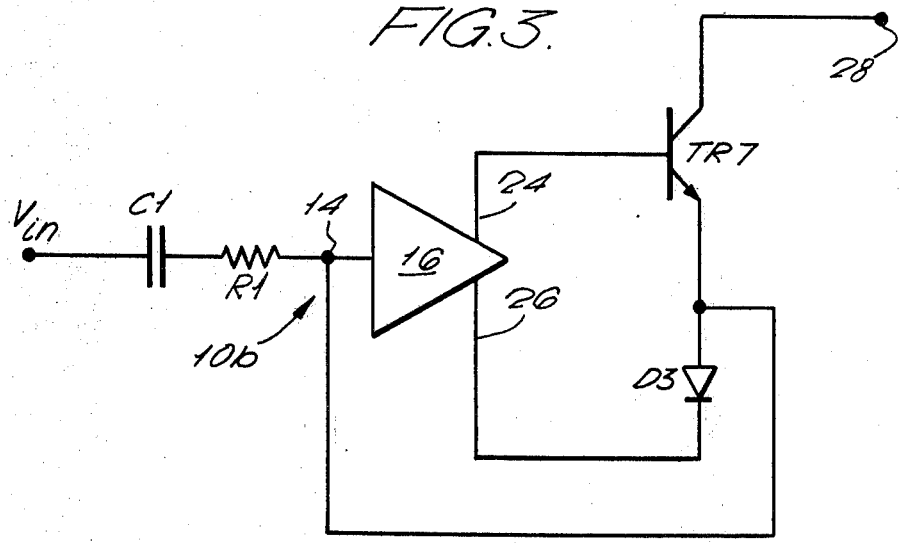

The invention will now be described, merely by way of example, with reference to the accompanying drawings, of which:

FIG. 1 is a circuit diagram of a rectifying circuit in accordance with the present invention; and FIGS. 2 and 3 are circuit diagrams of alternative embodiments of the rectifying circuit of FIG. 1, also in accordance with the present invention.

The rectifying circuit shown in FIG. 1 is indicated generally at 10, and comprises an input terminal 12 connected via a capacitor C1 and a resistor R1 in series to the input 14 of a high gain A.C. inverting amplifier 16. The amplifier 16 is extremely simple in design, and comprises first and second NPN transistors TR1, TR2 connected in cascade, the base of the first transistor TR1 constituting the input 14. The transistor TR1 is connected as an emitter follower, with its collector connected to a positive power supply rail 18 and its emitter connected to the base of the transistor TR2, while the transistor TR2 is connected in the grounded emitter configuration, with its emitter connected to a zero volt power supply rail 20 and its collector connected via a diode D1 to a constant current source 22.

The source 22 may conveniently comprise a PNP transistor TR3, whose emitter is connected to the rail 18 via a resistor R2 and whose base is connected to receive a suitable bias voltage $V_{B1}$. The collector of the transistor TR3 is connected to the anode of the diode D1, so that this diode is forward-biased during normal operation of the amplifier 16. The anode and cathode of the diode D1 respectively constitute first and second outputs 24, 26 of the amplifier 16, so the respective output voltages appearing at these outputs track each other very closely but have a D.C. separation equal to the forward voltage drop across the diode D1.

The output 24 of the amplifier 16 is connected to the anode of a diode D2, whose cathode is connected to the input 14 of the amplifier, while the output 26 is connected to the respective emitters of two matched NPN transistors TR4, TR5. The bases of the transistors TR4, TR5 are connected to receive a suitable common bias voltage $V_{B2}$. The collector of the transistor TR4 is connected to the input 14 of the amplifier 16, while the collector of the transistor TR5 constitutes the output terminal 28 of the circuit 10 and may be connected, for example, to a low pass filter (not shown).

In operation, an A.C. input voltage $V_{in}$ to be rectified is applied between the input terminal 12 and the rail 20, and causes an alternating current proportional to $V_{in}$ to flow in the resistor R1, the capacitor C1 serving to block any D.C. component which may be present in the input voltage. This alternating current is amplified by the transistors TR1, TR2 in the amplifier 16, producing respective alternating voltages, inverted with respect to the input voltage $V_{in}$, at the outputs 24, 26 of the amplifier 16.

The diode D2 is rendered conductive by the positive half cycles of the voltage at the output 24, and thus constitutes a negative feedback path around the amplifier 16, from the output 24 to the input 14, during these positive half cycles. Similarly, the base-emitter junction of the transistor TR4 is rendered conductive by the negative half cycles of the voltage at the output 26, and the transistor TR4 thus constitutes a negative feedback path around the amplifier 16, from the output 26 to the input 14, during these negative half cycles. The amplifier 16 therefore operates to cause a half-wave rectified feedback current $I_{F1}$, substantially equal in magnitude but opposite in polarity to the current flowing in the resistor R1 during the negative half cycles of the input voltage $V_{in}$, to flow in the diode D2 during the negative half cycles of the input voltage, and to cause another half wave rectified feedback current $I_{F2}$, substantially equal in magnitude but opposite in polarity to the current flowing in the resistor R1 during the positive half cycles of the input voltage $V_{in}$, to flow in the transistor TR4 during the positive half cycles of the input voltage.

The diode D1 between the outputs 24, 26 serves merely to reduce the magnitude of the voltage excursions required at the outputs 24, 26 to render the diode D2 conductive when the base-emitter junction of the transistor TR4 goes non-conductive and to render the base-emitter junction of the transistor TR4 conductive when the diode D2 goes non-conductive: it will be appreciated, therefore, that the diode D1 can be omitted if desired.

Since the voltage applied by the amplifier 16 between the base and emitter of the transistor TR4 to produce the feedback current $I_{F2}$ is also applied between the base and emitter of the transistor TR5, and since moreover the transistors TR4 and TR5 are matched, the amplifier causes an output current $I_{out}$ substantially equal to the current $I_{F2}$ to flow in the transistors TR5. The transistor TR5 therefore operates to copy the current flowing in the transistor TR4. This output current can be applied, as mentioned earlier, to a low-pass filter, which charges to a voltage dependent upon the magnitude of the output current and therefore dependent on the amplitude of the input voltage $V_{in}$.

The particular characteristics of the transistors TR4, TR5 which should be matched are their respective common base current gains ($h_{FB}$ and the current-voltage laws of their respective emitter-base junctions. This matching is achieved by implementing them, preferably together with the remainder of the circuit 10, as an integrated circuit on a common substrate. It is not necessary that the currents $I_{F2}$ and $I_{out}$ be exactly equal, and in practice these currents may differ by 20% or more: however, the currents should be proportional to each other, and this is what is achieved by the matching.

Because the output terminal 28 of the circuit 10 is constituted by a "free collector", i.e. the collector of the transistor TR5, the input offset voltage of the amplifier 16 is not critical: this is the reason why a relatively simple amplifier, as shown in FIG. 1, can be used as the amplifier 16, instead of the usual relatively complex differential amplifier normally used in conventional prior art rectifying circuits. Obviously, however, a more complex amplifier, for example having higher gain than that of the amplifier 16 of FIG. 1, can be employed if desired.

Additionally, this "free collector" output has an extremely high output impedance, and there is little or no feedback between the filter connected to the output terminal 28 and the rectifying action of the circuit 10.

The rectifying circuits shown in FIG. 2 and 3 are indicated generally at 10a and 10b respectively, and have many parts in common with the rectifying circuit 10 of FIG. 1. These common parts are given the same references as were used in FIG. 1, and only the points of difference will be described.

Referring first to FIG. 2, the transistors TR4, TR5 of FIG. 1 are replaced by a single, inverse-connected, NPN transistor TR6, having at least two substantially identical emitters E1, E2. The collector of the transistor TR6 is connected to the output 26 of the amplifier 16, the base is again connected to receive the bias voltage $V_{B2}$, the first emitter E1 is connected to the input 14 of the amplifier 16, and the second emitter E2 constitutes the output terminal 28. The rectifying circuit 10a is again implemented as an integrated circuit.

When a transistor, such as the transistor TR6, is operated in an inverse-connected mode, it behaves as if the collector were an emitter and the or each emitter were a collector, the main difference between inverse and normal operation being that, for inverse operation, there is some reduction in the current gain in comparison to that attained under normal operation. In the rectifying circuit 10a of FIG. 2, therefore, the base-collector junction of the transistor TR6 behaves as a rectifier to conduct only during negative half cycles of the voltage at the output 26. The transistor TR6 therefore causes a half-wave rectified feedback current $I_{F2}$ to flow between its first emitter E1 and the input 14 of the amplifier 16, in a manner analogous to that described with reference to FIG. 1. However, since the transistor TR6 has two substantially identical emitters E1 and E2, a current equal to $I_{F2} + I_{out}$ ( $\simeq 2I_{F2}$) to flow in the base-ond emitter E2. Thus the amplifier 16 operates to cause a current equal to $I_{F2} + I_{out}$ ( $\simeq 2I_{F2}$) to flow in the base-collector junction of the transistor TR6, so that the transistor TR6 serves not only as a rectifier, but also to copy the half wave rectified feedback current in order to supply the copied current to the second emitter E2.

The rectifying circuit 10a has substantially the same advantages as the rectifying circuit 10 of FIG. 1, since the emitter E2 of the transistor TR6 behaves analogously to a "free collector". Again, the matching is achieved by the integrated circuit implementation, and it is sufficient that the currents $I_{F2}$ and $I_{out}$ be merely approximately equal rather than exactly equal.

In the rectifying circuit 10b of FIG. 3, the transistors TR4, TR5 of FIG. 1 are replaced by a diode D3 having its anode and cathode connected to the input 14 and output 26 respectively of the amplifier 16, while the diode D2 is replaced by a single NPN transistor TR7. The base of the transistor TR7 is connected to the output 24 of the amplifier 16, the emitter is connected to the input 14 of the amplifier 16, and the collector constitutes the output 28.

In operation, the base-emitter junction of the transistor TR7 conducts only during positive half cycles of the voltage at the output 24 of the amplifier 16. The main difference between the operation of the rectifying circuit 10 of FIG. 1 and the rectifying circuit 10b is that in the latter only a small part of the feedback current conducted by the transistor TR7, viz the base current, is supplied by the amplifier 16, the remainder forming the output from the "free collector" of the transistor TR7. The current gain $h_{FB}$ of the transistor TR7 therefore constitutes a scaling factor for the rectifier. This current gain varies with current level, and also varies between transistors, so the circuit 10b is not as accurate as the circuits 10 and 10a. However, these errors can be substantially reduced by replacing the transistor TR7 with a field effect transistor whose emitter (source), base and collector (drain) are connected identically to those of the transistor TR7.

Several modifications can be made to the described embodiments of the invention. For example, in the rectifying circuit 10, the transistor TR4 can be replaced by a diode having its anode and cathode connected to the input 14 and output 26 of the amplifier 16, the base-emitter junction of the transistor TR5 being connected in parallel with the diode. This arrangement does not provide the same accuracy as that obtainable with the circuit 10, but may be adequate for some applications. Also, a further diode may be provided with its anode connected to the anode ot the diode D2 and its cathode connected to a source of a suitable bias voltage substantially equal to the D.C. voltage level at the input 14 of the amplifier 16. This provides more balanced operating conditions for the amplifier 16, in that the respective currents supplied by the amplifier during positive and negative half cycles of the input voltage become substantially equal.

What is claimed is:

1. A rectifying circuit comprising a high gain A.C. amplifier for receiving an A.C. input singal to be rectified, first and second rectifying means connected in respective negative feedback paths between the output of the amplifier and its input, said paths being arranged to pass respective feedback currents of opposite polarity, and current copying means responsive to the signal applied by the amplifier to one of the rectifying means to pass a current substantially proportional to the feedback current in said one rectifying means, the rectified output signal from the circuit being derived from the current copying means.

2. A rectifying circuit as claimed in claim 1, wherein the current copying means comprises a transistor whose base-emitter junction is connected in parallel with said one rectifying means and whose collector constitutes the output of the circuit.

3. A rectifying circuit as claimed in claim 2, wherein said one rectifying means comprises a semiconductor diode.

4. A rectifying circuit as claimed in claim 2, wherein said one rectifying means comprises the base-emitter junction of a second transistor substantially matched to the firstmentioned transistor, the collector of the second transistor being connected to the input of the amplifier.

5. A rectifying circuit as claimed in claim 1, wherein the current copying means and said one rectifying means together comprise an inverse-connected transistor having at least first and second emitters, the first emitter and the collector of the transistor being respectively connected to the input and to the output of the amplifier, and the second emitter constituting the output of the circuit.

6. A rectifying circuit as claimed in claim 1, wherein the current copying means is arranged to pass a current approximately equal to the feedback current in said one rectifying means.

* * * * *

UNITED STATES PATENT OFFICE
CERTIFICATE OF CORRECTION

Patent No. 4,004,161          Dated January 18, 1977

Inventor(s) Alan Ryder

It is certified that error appears in the above-identified patent and that said Letters Patent are hereby corrected as shown below:

IN THE SPECIFICATION:

Column 4, line 57 after "current" insert -- $I_{out}$ substantially equal to $I_{F2}$ flows in its second emitter $E_2$. Thus the amplifier 16 operates to cause a current --.

Column 4, cancel lines 58 and 59.

Signed and Sealed this

Eighteenth Day of April 1978

[SEAL]

Attest:

RUTH C. MASON
*Attesting Officer*

LUTRELLE F. PARKER
*Acting Commissioner of Patents and Trademarks*